US012750948B2

(12) United States Patent
Ono et al.

(10) Patent No.: US 12,750,948 B2
(45) Date of Patent: Sep. 29, 2026

(54) METHOD FOR MANUFACTURING CIRCUIT BOARD

(71) Applicant: MITSUI MINING & SMELTING CO., LTD., Tokyo (JP)

(72) Inventors: Hiroshi Ono, Ageo (JP); Kazuhiro Osawa, Ageo (JP); Kei Takahashi, Ageo (JP)

(73) Assignee: Mitsui Kinzoku Company, Limited, Tokyo (JP)

( * ) Notice: Subject to any disclaimer, the term of this patent is extended or adjusted under 35 U.S.C. 154(b) by 170 days.

(21) Appl. No.: 18/847,957

(22) PCT Filed: Mar. 18, 2022

(86) PCT No.: PCT/JP2022/012826

§ 371 (c)(1),
(2) Date: Sep. 17, 2024

(87) PCT Pub. No.: WO2023/175963

PCT Pub. Date: Sep. 21, 2023

(65) Prior Publication Data

US 2025/0220806 A1 Jul. 3, 2025

(51) Int. Cl.
*H05K 1/02* (2006.01)
*H05K 1/09* (2006.01)
(Continued)

(52) U.S. Cl.
CPC ............... *H05K 1/025* (2013.01); *H05K 1/09* (2013.01); *H05K 3/022* (2013.01); *H05K 3/386* (2013.01)

(58) Field of Classification Search
CPC ........................................ H05K 1/025
(Continued)

(56) References Cited

U.S. PATENT DOCUMENTS

2004/0174228 A1* 9/2004 Kanno .................... H01P 3/003 333/34
2009/0188702 A1* 7/2009 Muro .................. H05K 1/0218 174/254
(Continued)

FOREIGN PATENT DOCUMENTS

JP 4-293170 10/1992
JP H 04293170 * 10/1992
(Continued)

*Primary Examiner* — Stanley Tso
(74) *Attorney, Agent, or Firm* — GREENBLUM & BERNSTEIN, P.L.C.

(57) ABSTRACT

A method for manufacturing a circuit board that achieves both high adhesion and excellent high-frequency characteristics is provided. The circuit board includes a high-frequency circuit including a substrate, a ground layer, and a signal layer, and at least the signal layer is a layer derived from a copper foil. The method includes: (a) designing a specification of a high-frequency circuit having a predetermined impedance $Z_1$ based on an assumption that the high-frequency circuit is manufactured using a copper foil without an adhesive layer; and (b) forming a high-frequency circuit in accordance with the specification, except for using, instead of the copper foil without an adhesive layer, an adhesive-layer-attached copper foil to form the signal layer so that an adhesive layer is interposed between the substrate and the signal layer, thereby manufacturing a circuit board in which the high-frequency circuit has an impedance $Z_2$ that is greater than $Z_1$.

6 Claims, 3 Drawing Sheets

(51) Int. Cl.
*H05K 3/02* (2006.01)
*H05K 3/38* (2006.01)

(58) Field of Classification Search
USPC .......................................................... 174/250
See application file for complete search history.

(56) References Cited

U.S. PATENT DOCUMENTS

| | | | |
|---|---|---|---|
| 2013/0199828 A1 | 8/2013 | Nakabayashi et al. | |
| 2017/0208686 A1* | 7/2017 | Fukuchi .................... | C22F 1/08 |
| 2021/0029823 A1 | 1/2021 | Hosoi et al. | |
| 2022/0232696 A1* | 7/2022 | Shen .................... | H05K 3/4679 |

FOREIGN PATENT DOCUMENTS

| | | | |
|---|---|---|---|
| JP | 2000-091466 | * | 3/2000 |
| JP | 2017-130658 | | 7/2017 |
| KR | 10-2014-0031161 | | 3/2024 |
| WO | 2019/188087 | | 10/2019 |

* cited by examiner

METHOD FOR MANUFACTURING CIRCUIT BOARD

TECHNICAL FIELD

The present invention relates to a method for manufacturing a circuit board.

BACKGROUND ART

Circuit boards are widely used in electronic devices such as portable electronic devices. In particular, as the functions on portable electronic devices and the like have become more advanced in recent years, signal frequency has been increasing, and there is a need for circuit boards suitable for such high-frequency applications. It is desirable that such a high-frequency circuit board has a low transmission loss in order to be able to transmit high-frequency signals without a deterioration in quality. Circuit boards have a layer derived from a copper foil formed in a wiring pattern and an insulating resin substrate (resin layer), but transmission loss is mainly due to conductor loss caused by the copper foil and dielectric loss caused by the insulating resin substrate.

Therefore, for a resin-layer-attached copper foil to be used in high-frequency applications, it is desirable to suppress the dielectric loss caused by the resin layer. For this purpose, the resin layer is required to have excellent dielectric properties, and in particular, a small dielectric loss tangent. However, there is a problem in that a resin layer having a small dielectric loss tangent generally has low adhesion to the copper foil.

On the other hand, conductor loss can increase due to the skin effect of copper foil, which becomes more pronounced as the frequency increases. Therefore, to suppress transmission loss in high-frequency applications, the copper foil needs to be made smoother and rough particles need to be made finer in order to reduce the skin effect of the copper foil. However, as the copper foil becomes smoother, adhesion with the resin layer decreases.

To solve these problems, it has been proposed to manufacture a copper-clad laminate or a circuit board by using an adhesive-layer-attached copper foil, which has an ultra-thin adhesive layer (also called a primer layer) on the surface of the copper foil. For example, Patent Literature 1 (International Publication No. WO 2019/188087) discloses a copper-clad laminate that includes, a copper foil, an adhesive layer, and a resin layer, in this order, wherein a maximum height Sz on the surface of the copper foil on the adhesive layer side is 6.8 μm or less, and a dielectric loss tangent value δa of the adhesive layer is equal to or lower than the dielectric loss tangent value δr of the resin layer. It is stated that with this copper-clad laminate, it is possible to improve the transmission characteristics exhibited by the resin layer while ensuring sufficient peel strength between the copper foil and the resin layer.

CITATION LIST

Patent Literature

Patent Literature 1: International Publication No. WO 2019/188087

SUMMARY OF INVENTION

Incidentally, the circuit provided on the circuit board has a predetermined impedance value (for example, 50Ω), and it is known that if the impedance value deviates from this value, the electrical signal is reflected, resulting in a phenomenon in which the signal does not enter the circuit (reflection loss). Therefore, when designing a circuit, impedance is controlled by adjusting the width or height of the circuit, or the thickness or relative permittivity of the substrate, and the like.

In recent years, there has been an increasing need for even higher frequencies, such as 50 GHz. In such a high-frequency band, it has been found that the ultra-thin adhesive layer introduced between the resin substrate and the copper layer greatly affects the dielectric properties of the circuit board. For this reason, when an adhesive layer is introduced to improve the adhesion between the resin substrate and the copper layer, the impedance of the circuit may deviate from the designed value, and the high-frequency characteristics may be adversely affected by reflection loss. On the other hand, when designing a circuit based on the assumption of an adhesive layer, there is a problem in that the thickness, relative permittivity, and the like of the adhesive layer are added to the design elements, making the design difficult.

The present inventors have discovered that a circuit board that achieves both high adhesion and excellent high-frequency characteristics can be manufactured by forming a high-frequency circuit using an adhesive-layer-attached copper foil even based on the specification of a high-frequency circuit designed based on the assumption of using a copper foil without an adhesive layer.

Therefore, an object of the present invention is to provide a method for manufacturing a circuit board that achieves both high adhesion and excellent high-frequency characteristics.

According to an aspect of the present invention, there is provided a method for manufacturing a circuit board comprising a high-frequency circuit, wherein the high-frequency circuit comprises a substrate, a ground layer, and a signal layer, and at least the signal layer is a layer derived from a copper foil, wherein the method comprises the steps of:

(a) designing a specification of a high-frequency circuit having a predetermined impedance $Z_1$ based on an assumption that the high-frequency circuit is manufactured using a copper foil without an adhesive layer; and (b) forming a high-frequency circuit in accordance with the specification, except for using, instead of the copper foil without the adhesive layer as assumed in the specification, an adhesive-layer-attached copper foil to form the signal layer so that an adhesive layer is interposed between the substrate and the signal layer, thereby manufacturing a circuit board in which the high-frequency circuit has an impedance $Z_2$ that is greater than $Z_1$.

According to another aspect of the present invention, there is provided a circuit board manufactured by the above method, wherein an impedance excess rate calculated by the formula $((Z_2-Z_1)/Z_1)\times 100$ is 1% or more and 20% or less.

DESCRIPTION OF EMBODIMENTS

Method for Manufacturing Circuit Board

The present invention relates to a method for manufacturing a circuit board. As used herein, "circuit board" can also be referred to as a "printed circuit board", in which wiring is provided on the surface and/or interior of an insulating resin substrate. The definition of "circuit board" here includes both printed wiring boards that are in a state prior to electronic components being attached, and printed circuit boards that are in a state where electronic components are mounted.

Figure 1:
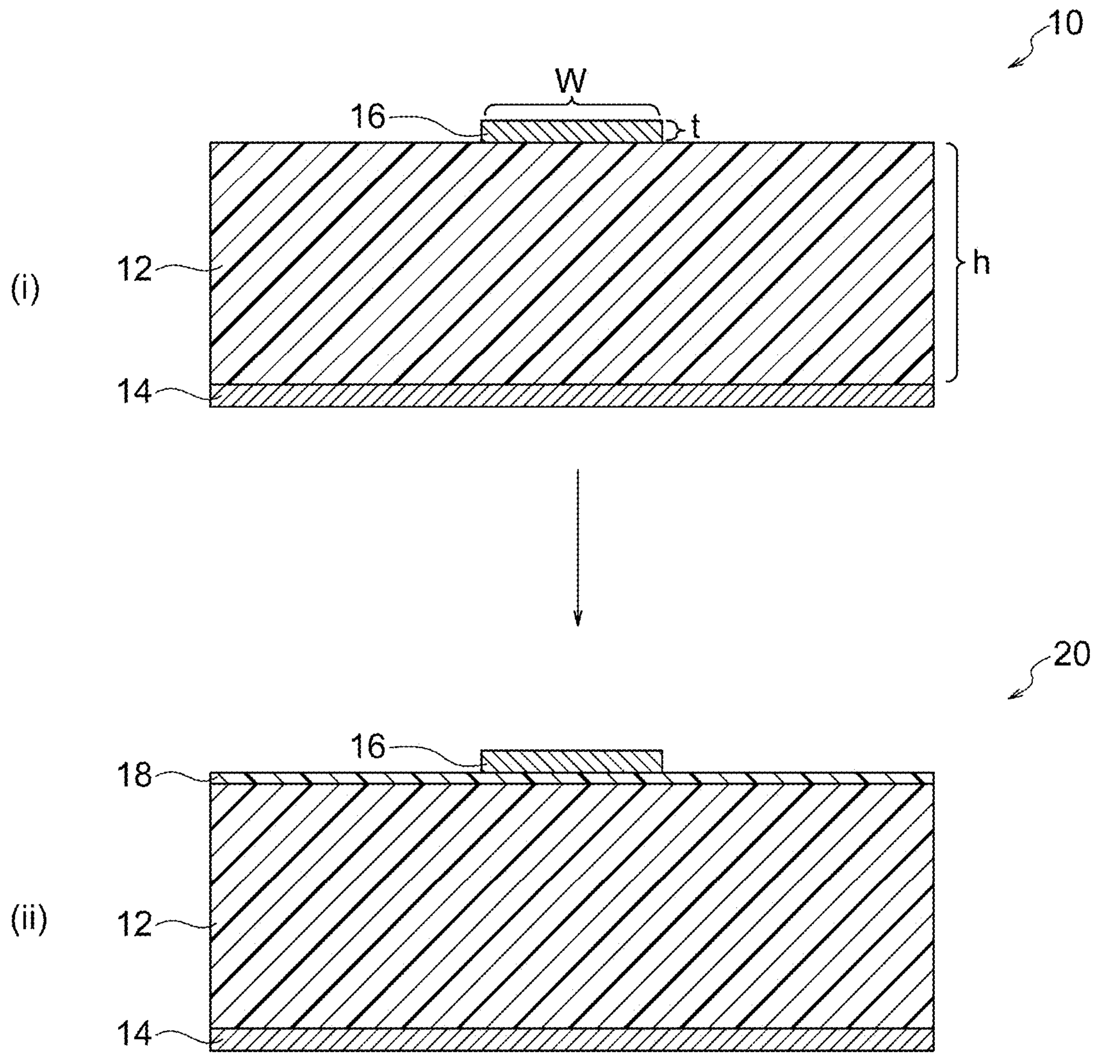
FIG. 1 is a process diagram showing an example of a method for manufacturing a circuit board of the present invention.

An example of the method for manufacturing a circuit board according to the present invention is shown in FIG. 1. The method of the present invention includes a step of designing a specification of a high-frequency circuit and a step of manufacturing a circuit board using an adhesive-layer-attached copper foil. Each step will be described below with reference to the drawings.

(1) Design of High-Frequency Circuit Specification

First, the specification of a high-frequency circuit having a predetermined impedance $Z_1$ is designed based on the assumption that the high-frequency circuit is manufactured using copper foil without an adhesive layer. As shown in the schematic cross-sectional view of the high-frequency circuit in FIG. 1(*i*), a high-frequency circuit 10 includes a substrate 12, a ground layer 14, and a signal layer 16. That is, the high-frequency circuit 10 designed in this step does not have an adhesive layer between the substrate 12 and the ground layer 14, nor between the substrate 12 and the signal layer 16. Thus, various specifications are designed so that the high-frequency circuit 10 without an adhesive layer has a predetermined impedance $Z_1$. For example, the standard value of the impedance $Z_1$ is set to a value between 40Ω and 120Ω, and examples thereof include 50Ω, 75Ω, 100Ω, and 120Ω, more typically 50Ω and 100Ω, and even more typically 50Ω.

The concrete specification of the high-frequency circuit 10 may be designed in accordance with a known method, but the specification preferably includes the respective sizes of the substrate 12, ground layer 14, and signal layer 16, and the materials of those parts (specific material, etc.). In particular, since the impedance (characteristic impedance) of a circuit depends on the dielectric properties and thickness h of the substrate 12, and the width w and height t of the signal layer 16, it is desirable to determine those conditions. In any case, since the high-frequency circuit 10 designed in this step does not include an adhesive layer, it is possible to easily design the circuit without considering the influence of an adhesive layer. Preferred modes of the substrate 12, ground layer 14, and signal layer 16 will now be described.

The substrate 12 can be a substrate that is commonly used as a resin substrate for a circuit board or a copper-clad laminate, and is not particularly limited. From the viewpoint of ensuring rigidity and insulation, a preferred substrate 12 includes a glass cloth and an insulating resin impregnated into the glass cloth, and is typically a prepreg. Preferred examples of the insulating resin used as the prepreg include an epoxy resin, a cyanate ester resin, a polyimide resin, a bismaleimide triazine resin (BT resin), a polyphenylene ether resin, a phenol resin, a liquid crystal polymer resin, a polytetrafluoroethylene resin (PTFE), and the like. However, the substrate 12 is not limited to the above-described substrates that have rigidity, and may be a flexible substrate. In that case, it is preferred that the substrate does not include the glass cloth.

From the viewpoint of reducing transmission loss, it is desirable that the relative permittivity of the substrate 12 at a frequency of 1 GHz be low, preferably 10 or less, more preferably 1 or more and 8 or less, further preferably 1 or more and 5 or less, and particularly preferably 1 or more and 4 or less. As used herein, the relative permittivity at 1 GHz means the relative permittivity measured by a parallel plate method in accordance with IPC-TM-650 2.5.5.9.

From the viewpoint of reducing transmission loss, it is desirable that the dielectric loss tangent of the substrate 12 at a frequency of 1 GHz be low, preferably 0.03 or less, more preferably 0.0001 or more and 0.02 or less, further preferably 0.0002 or more and 0.01 or less, particularly preferably 0.0003 or more and 0.005 or less, and most preferably 0.0004 or more and 0.004 or less. As used herein, the dielectric loss tangent at 1 GHz means the dielectric loss tangent measured by a parallel plate method in accordance with IPC-TM-650 2.5.5.9.

Although the thickness h of the substrate 12 is not particularly limited, and may be determined as appropriate in accordance with the application and the specified value of the impedance $Z_1$, the thickness h is preferably 1 μm or more and 2000 μm or less, more preferably 5 μm or more and 1500 μm or less, and further preferably 10 μm or more and 1200 μm or less.

The ground layer 14 is provided on the surface and/or interior of the substrate 12, and typically is provided on at least one surface of the substrate 12. The ground layer 14 may be a layer derived from copper foil (that is, a copper layer) or may be a layer composed of a metal other than copper, but is preferably a copper layer. The ground layer 14 may have a known structure employed in circuit boards. The width of the ground layer 14 is typically larger than the width w of the signal layer 16, which is described below, and may be provided over the entire surface of the substrate 12. The thickness of the ground layer 14 is not particularly limited, but is typically 1 μm or more and 100 μm or less, and more typically 1 μm or more and 35 μm or less.

The signal layer 16 is a layer derived from copper foil (that is, a copper layer), which is provided on the surface and/or interior of the substrate 12, and provided separated from the ground layer 14. Although the width w of the signal layer 16 is not particularly limited, and may be determined as appropriate in accordance with the application and the specified value of the impedance $Z_1$, the width w is preferably 1 μm or more and 5000 μm or less, more preferably 1 μm or more and 3000 μm or less, and further preferably 1 μm or more and 1000 μm or less. The height t of the signal layer 16 is also not particularly limited, and may also be determined as appropriate in accordance with the application and the specified value of impedance $Z_1$, but the height t is preferably 1 μm or more and 5000 μm or less, more preferably 1 μm or more and 3000 μm or less, and further preferably 1 μm or more and 1000 μm or less.

The high-frequency circuit 10 can have a known configuration, and is not particularly limited except that it includes the substrate 12, the ground layer 14, and the signal layer 16 described above. For example, the high-frequency circuit 10 may be a microstripline circuit in which the signal layer 16 is wired on the surface of the circuit board, or a stripline circuit in which the signal layer 16 is embedded and wired in the interior of the circuit board. Further, the high-frequency circuit 10 may be a circuit that outputs a single-ended signal in which one signal line is used for data transmission, or a circuit that outputs a differential signal in which a pair of signal lines is used for data transmission.

The circuit board may have a plurality of microstripline circuits and a plurality of stripline circuits. Further, the circuit board may be a multilayer board in which a plurality of ground layers 14 and a plurality of signal layers 16 are provided on the surface and/or interior of the substrate 12. When the circuit board is a multilayer board, the circuit board typically has a microstripline circuit on the surface layer of the circuit board and a stripline circuit on an inner layer of the circuit board.

The circuit board may include a circuit other than the high-frequency circuit 10 (for example, a low-frequency circuit of 100 MHz or less). A circuit other than the high-frequency circuit 10 can generally be identified by considering the linearity and position of the circuit, and checking whether the circuit is placed preferentially compared to other circuits on the circuit board. A more reliable way to identify such a circuit is to check whether the circuit is connected to the high-speed transmission portion of an electronic component such as an IC chip.

This step may include designing not only the specification of the high-frequency circuit 10 but also the specification of the entire circuit board. The specification of the circuit board can include, for example, selection of the various constituent materials, determination of the components to be mounted on the circuit board and the arrangement of those components, the mounting design that determines the mounting method and the like, and the wiring design that determines the layer structure, wiring rules, and the like.

(2) Manufacturing of Circuit Board

A circuit board including the high-frequency circuit is manufactured. As shown in the cross-sectional schematic diagram of a high-frequency circuit in FIG. 1(*ii*), during the manufacturing of this circuit board, the signal layer 16 is formed so that the adhesive layer 18 is interposed between the substrate 12 and the signal layer 16 by using an adhesive-layer-attached copper foil instead of a copper foil without an adhesive layer as is assumed in the specification described above. Other than that, a high-frequency circuit 20 is formed according to the above-described specification. In this way, a circuit board in which the high-frequency circuit 20 has an impedance $Z_2$ greater than $Z_1$ is manufactured. Preferred modes of the adhesive-layer-attached copper foil will be described later.

As described above, the circuit provided on the circuit board has a predetermined impedance value (for example, 50Ω). When the circuit deviates from this impedance value, the electrical signal is reflected, causing a phenomenon in which the signal no longer enters the circuit (reflection loss). Therefore, when designing a circuit, impedance is controlled by adjusting the width and the height of the circuit, or adjusting the thickness or relative permittivity of the substrate, and the like.

As described above, with the increasing need for even higher frequencies, there is a risk that an ultra-thin adhesive layer introduced between the substrate and the copper layer (signal layer) may cause the impedance of the circuit to deviate from the design value, and that high-frequency characteristics may be adversely affected by the reflection loss. Therefore, when forming the high-frequency circuit 20 using an adhesive-layer-attached copper foil, the circuit would normally be designed in consideration of the influence of the adhesive layer 18 so that the high-frequency circuit 20 has the predetermined impedance $Z_1$.

The inventors studied this point, and learned that even if the high-frequency circuit 20 including the adhesive layer 18 has an impedance $Z_2$ that is greater than $Z_1$, the adhesive layer 18 can reduce the transmission loss caused by the substrate 12, and that this effect of reducing transmission loss unexpectedly exceeded the negative impact of reflection loss. In addition, it was found that this reduction effect is more noticeable in a high-frequency band of 10 GHz or higher. Therefore, according to the method of the present invention, it is possible to easily design a circuit without considering the influence of the adhesive layer 18 as described above. Moreover, a circuit board manufactured by the method of the present invention has excellent adhesion between the substrate 12 and the signal layer 16 due to the introduction of the adhesive layer 18, and also has excellent high-frequency characteristics.

The impedance $Z_2$ of the high-frequency circuit 20 is calculated by the formula $((Z_2-Z_1)/Z_1)\times100$, and the impedance excess rate is preferably 1% or more and 20% or less, more preferably 1% or more and 15% or less, further preferably 1% or more and 10% or less, particularly preferably 1% or more and 7% or less, and most preferably 1% or more and 5% or less. As such it is possible to reduce transmission loss much more effectively while minimizing the influence of reflection loss.

When the length of the high-frequency circuit 20 is L (mm), it is preferred that $Z_2$ satisfy the following expression.

$$Z_1 < Z_2 \leq \{(1/15)\times(L+755)\}\times Z_1/50$$

That is, the inventors found that the more that the impedance $Z_2$ of the high-frequency circuit 20 deviates from the predetermined impedance $Z_1$, the larger the reflection loss becomes, but the level of reflection loss depends on the length L of the high-frequency circuit 20. In this regard, when the impedance $Z_2$ of the high-frequency circuit 20 satisfies the above expression, transmission loss can be reduced much more effectively while minimizing the influence of reflection loss. The length L of the high-frequency circuit 20 (typically the length of the signal layer 16) is preferably 1 mm or more and 1000 mm or less, more preferably 1 mm or more and 500 mm or less, further preferably 1 mm or more and 300 mm or less, and particularly preferably 1 mm or more and 100 mm or less.

If the high-frequency circuit 20 has a curved portion, the length L of the high-frequency circuit 20 is the total length of the line passing through the center of the circuit in a plan view of the circuit board. Further, if the circuit board is multi-layered and the high-frequency circuit is arranged three-dimensionally (that is, there is a portion that is connected in the depth direction (thickness direction of the circuit board) in the plan view), the length of that portion is also added to the total.

The method for manufacturing the circuit board is preferably used for a high-frequency circuit that performs data transmission at 1 GHz or higher, more preferably 3 GHz or higher, and further preferably 10 GHz or higher and 400 GHz or lower.

Figure 2:
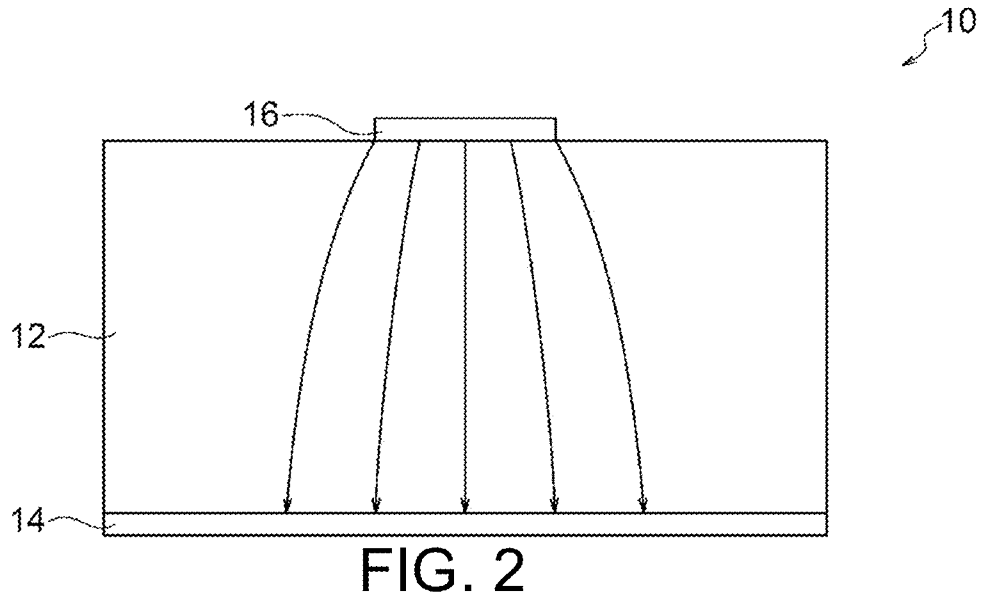
FIG. 2 is a schematic diagram of a high-frequency circuit, with arrows indicating lines of electric force in the circuit.

In this step, it is preferred to use a copper foil without an adhesive layer to form the ground layer 14. Here, a schematic diagram of the high-frequency circuit 10 is shown in FIG. 2. In the high-frequency circuit 10 shown in FIG. 2, lines of electric force from the signal layer 16 toward the ground layer 14 are indicated by arrows. The higher the density of the lines of electric force, the stronger the electric field, and so as shown in FIG. 2, the electric field around the signal layer 16 is stronger than the electric field around the ground layer 14. Further, when the interlayer distance between the ground layer 14 and the signal layer 16 is larger (that is, when the thickness h of the substrate 12 is increased), the electric field in the portion around the ground layer 14 is further weakened. Therefore, it can be said that providing the adhesive layer 18 between the substrate 12 and the signal layer 16 is more effective in reducing transmission loss than providing the adhesive layer 18 between the substrate 12 and the ground layer 14. However, an adhesive-layer-attached copper foil may be used to form the ground layer 14, and in such a case, although the effect is inferior to the case where adhesive-layer-attached copper foil is used to form the signal layer 16, there is an effect of reducing transmission loss.

The high-frequency circuit 20 and the circuit board including the same may be formed in accordance with the designed specification, except that the signal layer 16 is formed using an adhesive-layer-attached copper foil instead of a copper foil without an adhesive layer. That is, except for including the adhesive layer 18 (thereby increasing the impedance from $Z_1$ to $Z_2$), the manufactured high-frequency circuit 20 may be the same as the high-frequency circuit 10 when it was designed.

Circuit Board

According to a preferred mode of the present invention, a circuit board manufactured by the method described above is provided. As shown in FIG. 1(*ii*), the circuit board of the present invention includes a high-frequency circuit 20 that includes a substrate 12, a ground layer 14, a signal layer 16, and an adhesive layer 18. The preferred modes of the substrate 12, ground layer 14, and signal layer 16 are as described above. Further, a preferred mode of the adhesive layer 18 is described later.

As described above, the impedance excess rate of the high-frequency circuit 20 calculated by the formula $((Z_2-Z_1)/Z_1)\times 100$ is 1% or more and 20% or less, preferably 1% or more and 15% or less, more preferably 1% or more and 10% or less, further preferably 1% or more and 7% or less, and particularly preferably 1% or more and 5% or less. Further, when the length of the high-frequency circuit is L (mm), it is preferred that $Z_2$ satisfy the following expression.

$$Z_1 < Z_2 \le \{(1/15)\times(L+755)\}\times Z_1/50$$

As described above, the high-frequency circuit 20 is preferably used for data transmission at a frequency of 1 GHz or higher, more preferably 3 GHz or higher, and further preferably 10 GHz or higher and 400 GHz or lower.

Adhesive-Layer-Attached Copper Foil

The adhesive-layer-attached copper foil used in the method of the present invention includes a copper foil and an adhesive layer 18 provided on the surface of the copper foil.

The copper foil may be an electrodeposited or rolled copper foil (so-called raw foil), or may be in the form of a surface-treated foil that has been surface-treated on at least one side. The surface treatment may be any of various surface treatments that are performed to improve or impart certain properties to the surface of copper foil (for example, rust prevention, moisture resistance, chemical resistance, acid resistance, heat resistance, and adhesion with a substrate). The surface treatment may be performed on at least one side of the copper foil, or may be performed on both sides of the copper foil. Examples of surface treatments performed on copper foil include a rust prevention treatment, a silane treatment, a roughening treatment, a barrier formation treatment, and the like.

A maximum height Sz on the surface of the copper foil on the adhesive layer 18 side is preferably 6.8 μm or less, more preferably 0.15 μm or more and 6.8 μm or less, further preferably 0.25 μm or more and 5.0 μm or less, and particularly preferably 0.3 μm or more and 3.0 μm or less. Within this range, transmission loss can be desirably reduced while ensuring sufficient adhesion with the substrate 12 via the adhesive layer 18. That is, it is possible to reduce conductor loss caused by the copper foil which may increase due to the skin effect of the copper foil, and achieve a further reduction in transmission loss. In this specification, "maximum height Sz" is a parameter representing the distance from the highest point to the lowest point on the surface, measured in accordance with ISO 25178.

A kurtosis Sku on the surface of the copper foil on the adhesive layer 18 side is preferably 2.0 or more and 4.0 or less, more preferably 2.2 or more and 3.8 or less, and further preferably 2.4 or more and 3.5 or less. Within this range, transmission loss can be desirably reduced. That is, it is possible to reduce conductor loss caused by the copper foil which may increase due to the skin effect of the copper foil, and achieve a further reduction in transmission loss. In the present invention, "kurtosis Sku" is a parameter representing the sharpness of the height distribution, which is measured in accordance with ISO 25178, and is also referred to as tailedness. Sku=3 means that the height distribution is a normal distribution, Sku>3 means that the surface has many sharp peaks and valleys, and Sku<3 means that the surface is flat.

A maximum peak height Sp on the surface of the copper foil on the adhesive layer 18 side is preferably 3.3 μm or less, more preferably 0.06 μm or more and 3.1 μm or less, further preferably 0.06 μm or more and 3.0 μm or less, and particularly preferably 0.07 μm or more and 2.9 μm or less. Within this range, transmission loss can be desirably reduced while ensuring sufficient adhesion with the substrate 12 via the adhesive layer 18. That is, it is possible to reduce conductor loss caused by the copper foil which may increase due to the skin effect of the copper foil, and achieve a further reduction in transmission loss. In this specification, "maximum peak height Sp" is a three-dimensional parameter representing the maximum value of the height from the average plane of the surface, measured in accordance with ISO 25178.

A root mean square gradient Sdq on the surface of the copper foil on the adhesive layer 18 side is preferably 0.01 or more and 2.3 or less, more preferably 0.02 or more and 2.0 or less, and further preferably 0.04 or more and 1.8 or less. Within this range, transmission loss can be desirably reduced while ensuring sufficient adhesion with the substrate 12 via the adhesive layer 18. That is, it is possible to reduce the conductor loss caused by the copper foil which may increase due to the skin effect of the copper foil, and achieve a further reduction in transmission loss. In this specification, "root mean square gradient Sdq" is a parameter calculated based on the root mean square of the gradient at all points in a defined area, measured in accordance with ISO 25178. In other words, since the root mean square gradient Sdq is a three-dimensional parameter that evaluates the magnitude of the local slope angle, it is possible to quantify the steepness of surface unevenness. For example, the Sdq of a completely flat surface is 0, and the Sdq increases if the surface is sloped. The Sdq of a plane consisting of a 45 degree slope component is 1.

The maximum height Sz, kurtosis Sku, maximum peak height Sp, and root mean square gradient Sdq described above can be calculated by measuring the surface profile of a predetermined measurement area (for example, a 10000 $\mu m^2$ area) on the copper foil surface with a commercially available laser microscope.

The thickness of the copper foil is not particularly limited, but is preferably 1 μm or more and 200 μm or less, more preferably 1 μm or more and 100 μm or less, and further preferably 1 μm or more and 35 μm or less. If the thickness is within this range, techniques such as a modified semi-additive method (MSAP), semi-additive method (SAP), and a subtractive method, which are common pattern forming methods for wiring formation, can be adopted. Further, a carrier-attached copper foil may be used as the copper foil.

The adhesive layer 18 is a layer that functions as a primer layer to improve the adhesion between the copper foil and the substrate 12. The adhesive layer 18 is typically used by coating the adhesive layer 18 onto a copper foil to obtain an adhesive-layer-attached copper foil, and then pasting the adhesive-layer-attached copper foil onto the substrate 12. However, it is also possible to manufacture a circuit board including a substrate and an adhesive-layer-attached copper foil by coating the adhesive layer 18 onto the substrate 12 first, and then laminating so that the adhesive layer 18 is in contact with the copper foil. The thickness of the adhesive layer 18 is preferably 20 μm or less, more preferably 0.5 μm or more and 15 μm or less, further preferably 0.5 μm or more and 12 μm or less, particularly preferably 1 μm or more and 8 μm or less, and most preferably 1 μm or more and 5 μm or less. As such it is possible to reduce transmission loss and achieve a more balanced improvement in the adhesion between the substrate 12 and the signal layer 16 while minimizing the influence of reflection loss.

The dielectric loss tangent of the adhesive layer 18 is preferably smaller than the dielectric loss tangent of the substrate 12. As such, the effect of a reduction in transmission loss can be exhibited much more effectively. Specifically, the dielectric loss tangent of the adhesive layer 18 at a frequency of 10 GHz is preferably 0.0035 or less, more preferably 0.0001 or more and 0.0030 or less, further preferably 0.0001 or more and 0.0020 or less, and particularly preferably 0.0001 or more and 0.0015 or less. Further, the relative permittivity of the adhesive layer 18 at a frequency of 10 GHz is preferably 6 or less, more preferably 1 or more and 5.5 or less, further preferably 1 or more and 5 or less, and particularly preferably 1 or more and 4 or less. The dielectric loss tangent and relative permittivity at 10 GHz are measured by a perturbation cavity resonator method.

The ratio between the relative permittivity of the substrate 12 and the relative permittivity of the adhesive layer 18 (substrate relative permittivity/adhesive layer relative permittivity) is preferably 0.5 or more and 5.0 or less, more preferably 0.6 or more and 4.0 or less, further preferably 0.8 or more and 3.5 or less, and particularly preferably 0.9 or more and 3.0 or less. As such, the electric flux density of the ground layer can be lowered, and the effect of a reduction in transmission loss can be exhibited much more effectively. Each of the relative permittivities is a value measured by the Fabry-Perot resonator method at 50 GHz.

The adhesive layer 18 preferably contains one or more selected from the group consisting of an arylene ether compound (for example, a polyphenylene ether resin), a polyimide resin (typically, a low dielectric polyimide resin), an olefin resin (for example, a polyethylene resin, a polypropylene resin, a polymethylpentene resin, or a cycloolefin resin), a liquid crystal polymer, a polyester resin, a polystyrene resin, a hydrocarbon elastomer, a benzoxazine resin, an active ester resin, a cyanate ester resin, a bismaleimide resin, a butadiene resin, a styrenic copolymer (for example, a hydrogenated or non-hydrogenated styrene-butadiene resin), an epoxy resins (for example, a dicyclopentadiene type epoxy resin), a fluororesin, a resin having a vinyl group, and copolymers thereof. All of these resins not only exhibit excellent adhesion performance with the substrate 12 and copper foil, but also have a small dielectric loss tangent, and therefore contribute to reducing transmission loss.

It is particularly preferred that the adhesive layer 18 contain an arylene ether compound. The weight average molecular weight of the arylene ether compound is preferably 30000 or more, more preferably 30000 or more and 300000 or less, further preferably 40000 or more and 200000 or less, and particularly preferably 45000 or more and 120000 or less. An arylene ether compound having a weight average molecular weight of 30000 or more is typically a polyarylene ether. The arylene ether compound is preferably a phenylene ether compound, such as polyphenylene ether. It is preferred that the arylene ether compound or phenylene ether compound be a compound that includes in the molecule a backbone represented by the following formula:

[Formula 1]

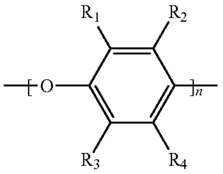

wherein $R_1$, $R_2$, $R_3$, and $R_4$ are each independently a hydrogen atom or a hydrocarbon group having 1 or more and 3 or less carbon atoms. Examples of the phenylene ether compound include a styrene derivative of a phenylene ether compound, a phenylene ether compound containing a maleic anhydride structure in the molecule, a terminal hydroxyl group-modified phenylene ether compound, a terminal methacrylic-modified phenylene ether compound, and a terminal glycidyl ether-modified phenylene ether compound. Examples of products of the arylene ether compound that include a maleic anhydride structure in the molecule and have a weight average molecular weight of 30000 or more include PME-80 and PME-82 manufactured by Mitsubishi Engineering-Plastics Corporation.

The arylene ether compound preferably has a reactive unsaturated bond. Alternatively, the adhesive layer 18 may further include an additional arylene ether compound having a reactive unsaturated bond. In this case, the additional arylene ether compound does not need to have a weight average molecular weight of 30000 or more. That is, the additional arylene ether compound can have a weight average molecular weight of less than 30000 (although it may have a weight average molecular weight of 30000 or more), and, for example, the additional arylene ether compound can have a number average molecular weight of 500 or more and 10000 or less. A reactive unsaturated bond is defined as an unsaturated bond that exhibits reactivity from heat or ultraviolet light. Preferred examples of the reactive unsaturated bond include a cyanate group, a maleimide group, a vinyl group, a (meth)acryloyl group, an ethynyl group, a styryl group, and combinations thereof. A styryl group is particularly preferred because it has high reactivity and the reaction can be controlled (makes it less likely for reactions that occur over time to occur, allows the resin to be stored, and can ensure a long product life).

The reactive unsaturated bond in the arylene ether compound is preferably located at or adjacent to the end of a molecular structure, since high reactivity is exhibited. For example, a 1,2-vinyl group is an example of a functional group having an unsaturated bond at the end of a molecular structure, and since the 1,2-vinyl group exhibits high reactivity, it is common as a functional group that can be used for radical polymerization. On the other hand, if an ethylenically unsaturated bond (a vinyl group not located at the end of a molecular structure) is present in the molecular backbone, reactivity decreases. Further, as an exception, when a benzene ring is adjacent to the unsaturated bond (for example, in the case of a styryl group), reactivity is high. Therefore, the position of the reactive unsaturated bond may be: a) at the end of a molecular structure (regardless of whether the molecular structure is the main chain or a side chain), or b) when a benzene ring is located at the end of a molecular structure (regardless of whether the molecular structure is the main chain or a side chain), adjacent to the benzene ring at the end. For example, the arylene ether compound may have a styryl group as the reactive unsaturated bond at both ends of a molecular structure. Examples of products of arylene ether compounds having a styryl group at both ends of the molecule include OPE-2St-1200 and OPE-2St-2200 manufactured by Mitsubishi Gas Chemical Company, Inc.

The content of the arylene ether compound having a weight average molecular weight of 30000 or more in the adhesive layer 18 is not particularly limited, but from the viewpoint of achieving both compatibility (which is related to peel strength and water resistance reliability) and dielectric properties, the content is, with respect to a total amount of the resin components (solid content) of 100 parts by weight, preferably 10 parts by weight or more and 60 parts by weight or less, more preferably 15 parts by weight or more and 55 parts by weight or less, further preferably 20 parts by weight or more and 50 parts by weight or less, and particularly preferably 25 parts by weight or more and 35 parts by weight or less.

The adhesive layer 18 preferably further contains a styrenic copolymer in addition to the above-described arylene ether compound. The styrenic copolymer may be either hydrogenated or non-hydrogenated. That is, the styrenic copolymer is a compound that includes a moiety derived from styrene, and is a polymer that may also contain a moiety derived from a compound having a polymerizable unsaturated group of an olefin or the like other than styrene. When a double bond is further present in the moiety derived from a compound having a polymerizable unsaturated group of a styrenic copolymer, the double bond may be hydrogenated or non-hydrogenated. Examples of the styrenic copolymer include an acrylonitrile-butadiene-styrene copolymer (ABS), a methacrylate-butadiene-styrene copolymer (MBS), an acrylonitrile-acrylate-styrene copolymer (AAS), an acrylonitrile-ethylene-styrene copolymer (AES), a styrene-butadiene copolymer (SBR), a styrene-butadiene-styrene copolymer (SBS), a styrene-ethylene-butadiene-styrene copolymer (SEBS), a styrene/4-methylstyrene-isoprene-butadiene block copolymer, and combinations thereof. Preferred examples include a styrene-butadiene block copolymer (SBR), a styrene/4-methylstyrene-isoprene-butadiene block copolymer, and combinations thereof, and particularly preferred are a styrene/4-methylstyrene-isoprene-butadiene block copolymer. The weight average molecular weight of the styrenic copolymer is not particularly limited, but is preferably 40000 or more and 400000 or less, further preferably 60000 or more and 370000 or less, and particularly preferably 80000 or more and 340000 or less.

The styrenic copolymer preferably has a reactive unsaturated bond in the molecule. A reactive unsaturated bond is defined as an unsaturated bond that exhibits reactivity from heat or ultraviolet light. Preferred examples of the reactive unsaturated bond include a cyanate group, a maleimide group, a vinyl group, a (meth)acryloyl group, an ethynyl group, a styryl group, and combinations thereof. A styryl group is particularly preferred because it has high reactivity and the reaction can be controlled (makes it less likely for reactions that occur over time to occur, allows the resin to be stored, and can ensure a long product life).

As in the case of the arylene ether compound, the reactive unsaturated bond in the styrenic copolymer is preferably located at or adjacent to the end of a molecular structure, since high reactivity is exhibited. For example, a 1,2-vinyl group is an example of a functional group having an unsaturated bond at the end of a molecular structure, and since the 1,2-vinyl group exhibits high reactivity, it is common as a functional group that can be used for radical polymerization. On the other hand, if an ethylenically unsaturated bond (a vinyl group not located at the end of a molecular structure) is present in the molecular backbone, reactivity decreases. Further, as an exception, when a benzene ring is adjacent to the unsaturated bond (for example, in the case of a styryl group), reactivity is high. Therefore, the position of the reactive unsaturated bond may be a) at the end of a molecular structure (regardless of whether the molecular structure is the main chain or a side chain), or b) when a benzene ring is located at the end of a molecular structure (regardless of whether the molecular structure is the main chain or a side chain), adjacent to the benzene ring at the end. Examples of products of the styrenic copolymer having a reactive unsaturated bond include Septon® V9461 (which has a styryl group) manufactured by Kuraray Co., Ltd., Ricon® 100, 181, and 184 (styrene-butadiene copolymers having a 1,2-vinyl group) manufactured by CRAY VALLEY, and Epofriend AT501 and CT310 (styrene-butadiene copolymers having a 1,2-vinyl group) manufactured by Daicel Corporation.

The styrenic copolymer preferably has a modified styrene butadiene. Alternatively, the adhesive layer 18 may further include an additional styrenic copolymer having a modified styrene butadiene. In this case, the same styrenic copolymer as described above can be used as the additional styrenic copolymer, except that it does not need to have a reactive unsaturated bond. That is, the additional styrenic copolymer can be a styrenic copolymer that does not have a reactive unsaturated bonds (although it may have a reactive unsaturated bond). The modified styrene-butadiene may be any styrene-butadiene that has been chemically modified through the introduction of any of various functional groups. Examples include an amine-modified styrene-butadiene, a pyridine-modified styrene-butadiene, a carboxy-modified styrene-butadiene, and the like, but an amine-modified styrene-butadiene is preferred. An example of a styrenic copolymer having a modified styrene-butadiene is Tuftec® MP10 manufactured by Asahi Kasei Corporation, which is a hydrogenated styrene-butadiene block copolymer and is an amine-modified product. Further, an example of an unmodified styrenic copolymer is TR2003 manufactured by JSR Corporation, which is a styrene-butadiene block copolymer.

The content of the styrenic copolymer having a reactive unsaturated bond in the adhesive layer 18 is not particularly limited, but from the viewpoint of achieving both compatibility and dielectric properties, the content of the styrenic copolymer having a reactive unsaturated bond is, with respect to a total amount of the resin components (solid content) of 100 parts by weight, preferably 5 parts by weight or more and 75 parts by weight or less, more preferably 10 parts by weight or more and 65 parts by weight or less, further preferably 15 parts by weight or more and 55 parts by weight or less, and particularly preferably 20 parts by weight or more and 43 parts by weight or less.

The content ratio in the adhesive layer 18 between the arylene ether compound having a weight average molecular weight of 30000 or more and the styrenic copolymer having a reactive unsaturated bond in the molecule is not particularly limited, but from the viewpoint of balancing adhesion, compatibility, and dielectric properties, when the content of the arylene ether compound having a weight average molecular weight of 30000 or more is P, and the content of the styrenic copolymer having a reactive unsaturated bond in the molecule is S, the weight ratio obtained by dividing S by P, (S/P ratio), is preferably 0.2 or more and 2.0 or less, more preferably 0.4 or more and 1.8 or less, further preferably 0.6 or more and 1.7 or less, and particularly preferably 1.0 or more and 1.5 or less.

The adhesive layer 18 may contain additives that are commonly added to resins and polymers. Examples of additives include a reaction initiator, a reaction accelerator, a flame retardant, a silane coupling agent, a dispersant, an antioxidant, and the like.

The adhesive layer 18 may further contain a filler. Examples of the filler include silica, talc, alumina, boron nitride (BN), a resin, and the like. The filler is not particularly limited as long as it can be dispersed in the adhesive layer 18, but silica is preferred from the viewpoint of dispersibility and dielectric properties. The average particle diameter D50 of the filler is preferably 0.1 μm or more and 3.0 μm or less, and more preferably 0.3 μm or more and 2.0 μm or less. If the average particle diameter D50 is within this range, interfaces (i.e., the specific surface area) will be reduced, which brings about various properties desirable as an electronic material, such as enabling a reduction in the adverse impact on dielectric properties, improving interlayer insulation, and eliminating coarse particles in the resin layer. The filler may be in any form such as pulverized particles, spherical particles, core-shell particles, and hollow particles. The content of the filler may be any amount and is not particularly limited, but from the viewpoint of ease of filler dispersion, the fluidity of the resin composition, and the like, the content of the filler is, with respect to a total amount of the above-described resin components (solid content) of 100 parts by weight, preferably 0 parts by weight or more and 150 parts by weight or less, more preferably 10 parts by weight or more and 130 parts by weight or less, further preferably 20 parts by weight or more and 100 parts by weight or less, and particularly preferably 30 parts by weight or more and 80 parts by weight or less. Here, the total amount of the resin components (solid content) of 100 parts by weight includes not only the polymers and resins, but also the weight of additives, such as a reaction initiator, constituting a part of the resins, but does not include fillers.

EXAMPLES

The present invention will be now be further described with reference to the following examples.

Example 1 (Comparison)

(1) Circuit Board Design

As shown in FIG. 1(*i*), a circuit board including a high-frequency circuit 10 including a substrate 12, a ground layer 14, and a signal layer 16 was designed. First, the thickness h of the substrate 12 was set to 136 μm, the relative permittivity of the substrate 12 at 50 GHz was set to 3.1, and the width w of the signal layer 16 was set to 300 μm. Then, patterns were selected such that when the circuit length of the signal layer 16 was 30 mm, 50 mm, 75 mm, or 100 mm, the impedance of the microstrip line circuit would be 50Ω.

(2) Circuit Board Production

The circuit board was produced based on the design determined in (1) above. First, as the substrate 12, a high-frequency substrate (manufactured by Panasonic Corporation, product number: MEGTRON7 series "R-5680", relative permittivity at 50 GHz measured by the Fabry-Perot resonator method: 3.1, dielectric loss tangent: 0.003) was prepared. A copper-clad laminate having an insulation thickness of 136 μm was obtained by laminating a roughened copper foil (manufactured by Mitsui Mining and Smelting Co., Ltd., SI-VSP, thickness 18 μm) on both sides of this substrate 12 so that the roughened surface was in contact with the substrate 12, and then pressing at a temperature of 190° C. and a press time of 120 minutes using a vacuum press machine. Then, the copper-clad laminate was etched to form the pattern selected in (1) above. In this way, circuit boards each having a microstrip line circuit with a circuit length of 30 mm, 50 mm, 75 mm, or 100 mm were produced.

Example 2

A circuit board was produced in the same manner as in Example 1, except the adhesive layer 18 was laminated so as to be in contact with the substrate 12 using, instead of roughened copper foil, an adhesive-layer-attached copper foil in which a 4 μm-thick adhesive layer 18 (relative permittivity at 50 GHz measured by the Fabry-Perot resonator method: 2.6, dielectric loss tangent: 0.0017) was provided on the surface of the roughened copper foil.

The adhesive-layer-attached copper foil was produced as follows. First, as the raw material components, with respect to 100 parts by weight of resin solid content, 30.10 parts by weight of an arylene ether compound having a weight average molecular weight of 30000 or more, 38.20 parts by weight of a styrenic copolymer having a reactive unsaturated bond in the molecule, 0.50 parts by weight of a reaction initiator, and 50.00 parts by weight of filler (not included in the resin solid content) were measured into a round flask, and toluene and methyl ethyl ketone were added as a mixing solvent. The raw material components were dissolved or dispersed by heating and stirring, and the mixture was then left to cool to obtain a resin varnish having a raw material component concentration of 13% by weight. The obtained resin varnish was coated onto the roughened surface of the above-described roughened copper foil using a gravure coating machine so that the thickness of the resin after drying was 4 μm, and then dried in an oven for 2 minutes at 150° C. to obtain the adhesive-layer-attached copper foil.

Example 3

A circuit board was produced in the same manner as in Example 2, except that the thickness of the adhesive layer was changed to 7 μm.

Example 4

A circuit board was produced in the same manner as in Example 2, except that the thickness of the adhesive layer was changed to 10 μm.

Example 5

A circuit board was produced in the same manner as in Example 2, except that the thickness of the adhesive layer was changed to 15 μm.

Various Evaluations

The circuit boards produced in Examples 1 to 5 were evaluated as follows.

<Impedance Measurement>

The impedance of the microstrip circuit provided on the circuit board was measured as follows. First, using an oscilloscope (manufactured by Tektronix, product number: DSA8200) equipped with a TDR sampling module (model name: 80E04), the module and circuit board were connected using a high-frequency cable with a 2.4 mm connector standard, and the measurement was conducted with the resolution of the horizontal scale of the screen set to 1.25 ps. The average of the impedance values obtained in the range of 0.3 ns to 0.6 ns from the input side circuit end face was taken as the impedance value of the circuit. Here, the input side circuit end face is taken to mean the point (unit: ns) at which the impedance value of the measurement system diverges when the connection point (mainly a probe or a connector is used) between the measurement system and the circuit is disconnected during measurement. For example, when the input side circuit end face is 42.6 ns, the average of the impedance values obtained in the range of 42.9 ns to 43.2 ns is the impedance value of the circuit. The results were as shown in Table 1.

<Transmission Loss Measurement>

The transmission loss of the microstrip line circuit of the obtained circuit board was measured at frequencies from 10 MHz to 50 GHz using a network analyzer (manufactured by Agilent, product number: PNA-X N5245A). The main body of the device and the circuit board were connected using a high-frequency cable with a 2.4 mm connector standard, and the setting conditions were as follows.

(Setting Conditions)

Power: −15 dBm

IF Bandwidth: 150 Hz

Number of measurement points: 501 points

Smoothing and Average were OFF

Figure 3A:
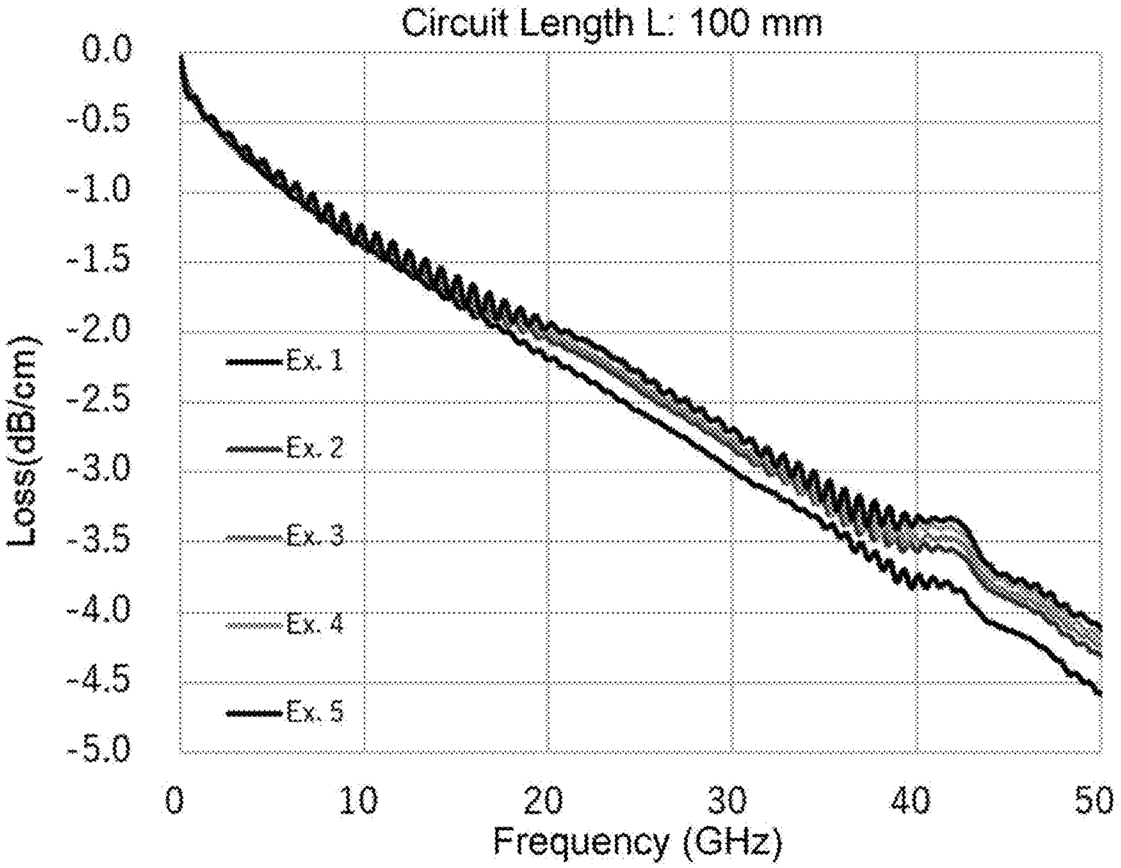
FIG. 3A is a graph showing transmission loss up to a frequency of 50 GHz in circuit boards having a circuit length of 100 mm produced in Examples 1 to 5.
Figure 3B:
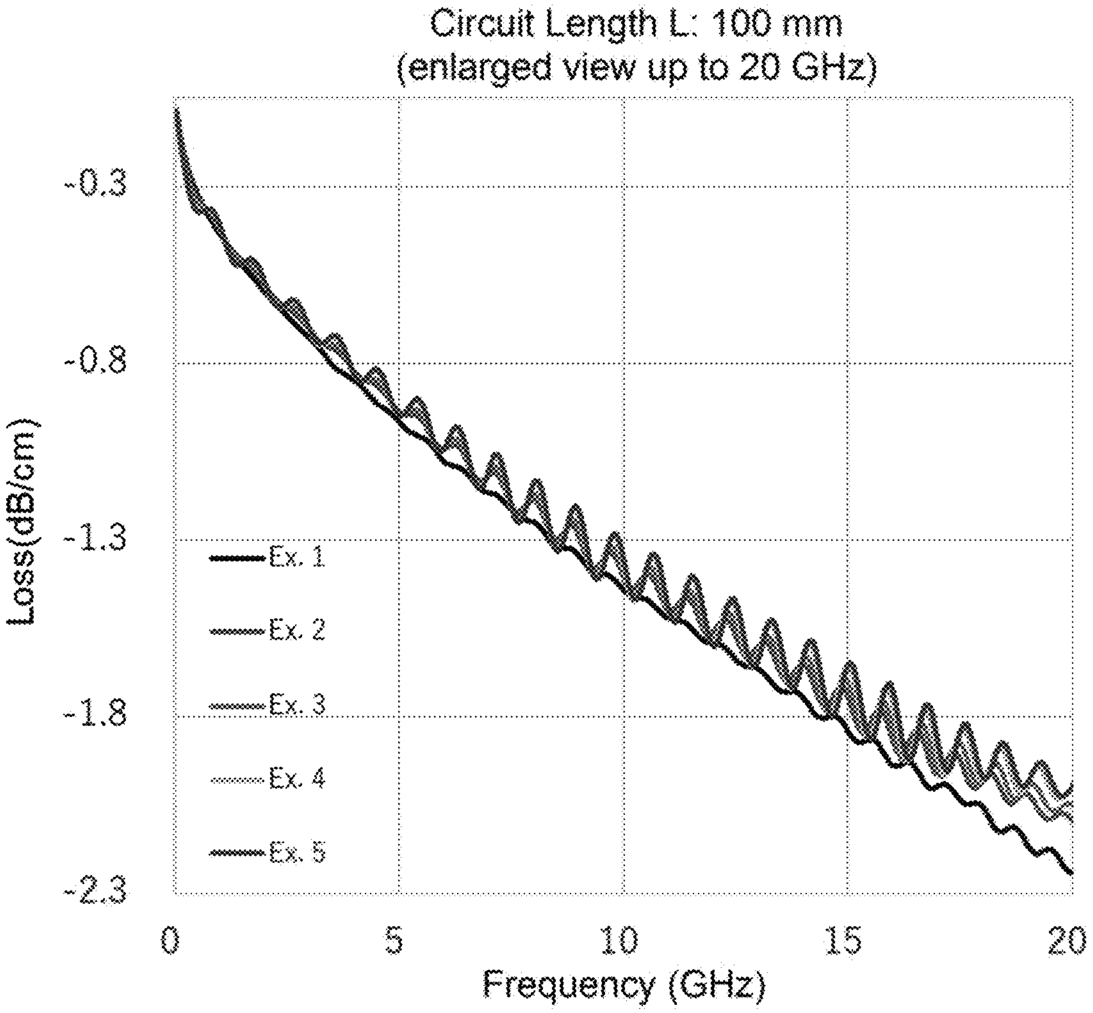
FIG. 3B is an enlarged view of the graph of FIG. 3A up to a frequency of 20 GHZ.

Electronic calibration kit: Ecal N4693-60001 was used, and the measurement was conducted after calibration at the end of the cable For Examples 2 to 5, the effect of a reduction in transmission loss was checked by comparing the transmission loss (dB/cm) from 10 MHz to 50 GHz with Example 1. Further, the magnitude of ripple, which is the phenomenon of waviness in the attenuation characteristics caused by reflected waves that occur when the impedance exceeds a specified value (50Ω), was also checked. For reference, a graph of transmission loss for a circuit length of 100 mm in Examples 1 to 5 is shown in FIG. 3A (up to a frequency of 50 GHZ) and FIG. 3B (enlarged view up to a frequency of 20 GHZ). The high-frequency characteristics were evaluated based on the following criteria from the checked transmission loss reduction effect and ripple magnitude. The results were as shown in Table 1.

Evaluation rank A: No ripple or only a tiny ripple, and the effect of a reduction in transmission loss is much greater over the whole measurement frequency range.

Evaluation rank B: There is ripple, but the effect of a reduction in transmission loss is greater for most measurement frequencies.

Evaluation rank C: Although there is large ripple, the effect of a reduction in transmission loss can be confirmed for the high-frequency band of 10 GHz or higher.

Evaluation rank D: No effect of a reduction in transmission loss.

TABLE 1

| | | | Ex. 1* | Ex. 2 | Ex. 3 | Ex. 4 | Ex. 5 |
|---|---|---|---|---|---|---|---|
| Thickness of adhesive layer (μm) | | | 0 | 4 | 7 | 10 | 15 |
| Impedance (Ω) | | | 51.7 | 53.6 | 54.8 | 56.4 | 57.6 |
| High-frequency characteristics (in comparison with Ex. 1) | Circuit length (mm) | 30 | — (standard) | C | C | C | C |
| | | 50 | — (standard) | B | C | C | C |
| | | 75 | — (standard) | A | C | C | C |
| | | 100 | — (standard) | A | B | C | C |

*Represents comparative example.

The invention claimed is:

1. A method for manufacturing a circuit board comprising a high-frequency circuit, wherein the high-frequency circuit comprises a substrate, a ground layer, and a signal layer, and at least the signal layer is a layer derived from a copper foil, wherein the method comprises:

(a) designing a specification of a high-frequency circuit having a predetermined impedance $Z_1$ based on an assumption that the high-frequency circuit is manufactured using a copper foil without an adhesive layer; and (b) forming a high-frequency circuit in accordance with the specification, except for using, instead of the copper foil without the adhesive layer as assumed in the specification, an adhesive-layer-attached copper foil to form the signal layer so that an adhesive layer is interposed between the substrate and the signal layer, thereby manufacturing a circuit board in which the high-frequency circuit has an impedance $Z_2$ that is greater than $Z_1$.

2. The method for manufacturing the circuit board according to claim 1, wherein a copper foil without an adhesive layer is used to form the ground layer.

3. The method for manufacturing the circuit board according to claim 1, wherein an impedance excess rate calculated by the formula $((Z_2-Z_1)/Z_1)\times100$ is 1% or more and 20% or less.

4. The method for manufacturing the circuit board according to claim 1, wherein when the length of the high-frequency circuit is L (mm), $Z_2$ satisfies the following formula: $Z_1<Z_2\leq\{(1/15)\times(L+755)\}\times Z_1/50$.

5. A circuit board manufactured by the method according to claim 1, wherein an impedance excess rate calculated by the formula $((Z_2-Z_1)/Z_1)\times100$ is 1% or more and 20% or less.

6. The circuit board according to claim 5, wherein when the length of the high-frequency circuit is L (mm), $Z_2$ satisfies the following formula:

$$Z_1 < Z_2 \leq \{(1/15)\times(L+755)\}\times Z_1/50.$$

* * * * *